United States Patent [19]

Feldstein

[11] 4,355,083

[45] Oct. 19, 1982

[54] ELECTROLESSLY METALLIZED SILVER COATED ARTICLE

[76] Inventor: Nathan Feldstein, 63 Hemlock Cir., Princeton, N.J. 08540

[21] Appl. No.: 106,499

[22] Filed: Dec. 26, 1979

Related U.S. Application Data

[62] Division of Ser. No. 803,777, Jun. 6, 1977, Pat. No. 4,181,760.

[51] Int. Cl.³ .......................... B32B 15/04; C23C 3/02
[52] U.S. Cl. .................................... 428/621; 427/305; 428/936
[58] Field of Search ............... 427/304, 305, 437, 438, 427/98, 306; 428/434, 457, 936, 621

[56] References Cited

U.S. PATENT DOCUMENTS

| | | | |
|---|---|---|---|
| 3,403,035 | 9/1968 | Schneble, Jr. et al. | 427/306 X |
| 3,666,529 | 5/1972 | Wright et al. | 427/305 |
| 3,772,056 | 11/1973 | Polichette et al. | 428/320 |
| 3,853,590 | 12/1974 | Kadison et al. | 427/437 |
| 3,870,526 | 3/1975 | Pearlstein et al. | 427/305 X |
| 3,958,048 | 5/1976 | Donovan et al. | 427/304 |
| 3,962,494 | 6/1976 | Nuzzi | 106/1.11 X |
| 3,993,801 | 11/1976 | Feldstein | 427/304 X |
| 4,002,778 | 1/1977 | Bellis et al. | 427/265 X |

OTHER PUBLICATIONS

Lowenheim, F. A., *Modern Electroplating*, New York, John Wiley & Sons, Inc., 1974, pp. 711, 727-728.

*Primary Examiner*—Evan K. Lawrence

[57] ABSTRACT

A process, article produced therefrom, and compositions are described for the reception of electroless plating onto a non-catalytic metallic surface. The process comprises contacting the non-catalytic surface with a promoter composition containing ions selected from the group of nickel, cobalt, iron and mixtures thereof and a suitable reducing agent, and thereafter contacting the substrate with an electroless plating bath comprising hypophosphite for the metallic build-up.

7 Claims, No Drawings

ELECTROLESSLY METALLIZED SILVER COATED ARTICLE

This is a division of application Ser. No. 803,777 filed June 6, 1977, U.S. Pat. No. 4,181,760.

BACKGROUND OF THE INVENTION

Electroless or autocatalytic plating of dielectric substrates finds wide-spread utility in the preparation of such diverse articles as printed circuits, automotive trim, mirrors, electronic devices, etc.

In the normal commercial electroless plating process, the dielectric substrate, which has been preferably etched by physical or chemical means to improve metal adhesion, is sensitized by exposure to a solution of stannous ions, e.g., a stannous chloride solution, and then activated by exposure to a solution of palladium ions, e.g., a palladium chloride solution. This activation is effected by reduction of the palladium ions to the zero valence state by the stannous ions to form palladium metal sites or by the formation of a tin/palladium complex on the surface of the dielectric substrate.

Thereafter, the activated substrate is plated by exposure to an electroless plating bath containing ions of the metal to be plated and a reducing agent capable of reducing (heterogeneously) the valence state of the plating ions present in the bulk solution to the metallic state. In conventional processes, copper is plated using an electroless plating bath comprised of copper ions and formaldehyde as a reducing agent. In the plating of nickel or cobalt, the reducing agent commonly used is sodium hypophosphite.

More recently, processes have been developed for electroless plating without the necessity of using palladium or other precious metals. For example, in U.S. Pat. Nos. 3,772,056 and 3,772,078, and non-metallic substrates are coated with a solution containing non-precious metal ions, i.e., ions of copper, nickel, cobalt or iron, and dried to form an adherent coating of the metal ions. Thereafter, the metal ions are reduced to the metallic state and the substrate is plated with a compatible electroless plating bath.

In U.S. Pat. No. 3,993,491 another procedure for effecting electroless plating of non-metallic substrates without the necessity of using palladium or any other precious metal ions is described. In the processes described therein, a non-metallic substrate is contacted with a stannous and copper ions to form a stannous-cuprous complex on the surface of the substrate. The copper ions are then reduced to their metallic state using a suitable reducing agent.

Still another procedure is described in U.S. Pat. No. 3,993,799. In the process described therein, hydrous oxide colloids of metal or metal ions are coated on the surface of a non-metallic substrate. The substrate is then rinsed and immersed in a solution containing a reducing agent capable of reducing the metal ions to the metallic state (or reducing the outer surface).

While significant cost savings are realized by coating the substrate with non-precious metal ions, as exemplified by the above disclosures, instead of with the more expensive palladium or other precious metal ions, care must be exercised in the selection of the electroless plating bath used with such systems. Specifically, conventional hypophosphite baths are not effective in the plating of nickel or cobalt onto the surface of substrates prepared using non-precious metals (e.g., copper or silver), in a commercially suitable manner. Instead, it is necessary in the plating of nickel and cobalt to use an electroless plating bath containing a stronger reducing agent such as a boron reducing agent, e.g., an amineborane, such electroless plating baths being disclosed, for example, in U.S. Pat. No. 3,338,726, or a borohydride, as shown in U.S. Pat. Nos. 2,461,661 and 3,045,334. Such reducing agents, because of their relatively higher cost, diminish the commercial savings to be realized in the use of such procedures. Also, in using the preceding non-precious metal systems, at times a lower site density is realized thus reducing the speed and effectiveness of plating onto the prepared substrates.

Procedures permitting the utilization of non-precious metal activated substrates while eliminating or minimizing the aforesaid disadvantages and permitting the utilization of conventional, commercially available electroless plating baths would be highly desirable.

It is also well documented in the art that there are a wide variety of metals and alloys which are non-catalytic for initiation of conventional electroless plating. Typical materials which are non-catalytic include copper, gold, silver, chromium containing stainless steels, Kovar, moly, manganese, aluminum and its alloys and other. In the prior art, exotic procedures have been adapted to provide such non-catalytic materials catalytic. Typical procedures well known are activated with palladium, the zincating method, impressing of a galvanic potential and others. It is well documented that such procedures are tedious and costly and it would be highly desirable to eliminate them by a simple treatment which potentially would be universal to all non-catalytic materials (metals and alloys). Surprisingly, I found that the composition disclosed may also be used effectively upon these non-catalytic materials and thereby render the surface of such material platable in conventional electroless plating baths. In an attempt to overcome such tedious procedures, a recent effort is described in U.S. 4,002,778 which is included herein by reference. However, there is still room for improvement with regard to the number of steps and the economy of the process used.

SUMMARY OF THE INVENTION

It is the principal object of the present invention to produce a metallized silver coated ceramic substrate prepared by the steps of (a) contacting the substrate to be coated with a promoter composition which comprises; metal ions and only a single reducing agent, said reducing agent being capable of chemically reacting with said substrate and the metal ions within the composition and wherein said metal ions are selected from the group of nickel, cobalt, and iron and wherein the relative concentration of the reducing agent to the metal ions is so adjusted as to permit the initial chemical interaction of the reducing agent with said substrate and then the heterogeneous reduction of some of the metal ions present in said composition, and then (b) contacting the treated substrate with a conventional electroless plating bath comprising hypophosphite and thereby depositing a metallic layer.

DETAILED DESCRIPTION OF THE INVENTION

The term "priming" as used in the present description means the formation of a coating of non-precious metal ions (or metals or alloys) including silver and other non-catalytic metal onto the surface of a non-metallic (dielectric) substrate or metallic substrates. The priming step does not per se form a part of the present invention. Priming may be effected by one of a number of techniques including the procedures described in the above-mentioned patents. Priming may also be effected by vapor deposition, spraying, printing, dipping, etc., or the formation of a metal in the metallic state on the substrate surface followed by permitting or causing the surface of the metal to oxidize. For certain purposes, priming may be on selected regions of the substrate, thereby resulting in selective plating.

Because of their particular effectiveness and commercial significance, the non-metallic substrates will normally be primed with copper ions, either cuprous or cupric, and the following description will be primarily directed to the plating of copper and silver primed substrates as well as non-catalytic metals and alloys. It is to be understood, however, that the present invention is broadly directed to the plating of non-metallic, metallic or semiconductor substrates primed with other metals or their ions, e.g., nickel, cobalt, iron, tin, mercury, silver, etc.

The term "developing" (or promoting) as used herein means the reduction of metal ions coated on the substrate to the metallic or zero valence state with a chemical reducing agent capable of effecting such reduction, or the initial interaction of the reducing agent with the non-catalytic metal (or alloy) previously deposited onto the substrate, or which is part of the substrate with the sequential deposition of metal (e.g., nickel, cobalt, iron) which is derived from the bulk solution of the developing medium. Accordingly, the developing medium will be referred to as "developer" or "promoter". It is recognized that the interaction of the promoter is a surface reaction; the properties of the nature of the bulk substrates is of no major concern. Accordingly, the concentration of the reducing agent must be so adjusted relative to the metal ions in the bulk solution as to insure the preferred sequence of chemical reactions. It is also noted that the promoter composition may also include other additives from pH adjusters to complexing agents which should be obvious to one skilled in the art. It is recognized that proper selection of complexing (or chelating) agents is important whereby the metal ions are complexed but still available for the heterogeneous reduction at moderate conditions (e.g., temperature and/or reducing agent concentration).

The term "non-catalytic metal" as used in the present invention refers to a wide variety of materials (metals or alloys) which are not catalytic and hence would not initiate conventional electroless plating. Typical materials may include, however are not limited to, copper, gold, silver, chromium containing steel, stainless steels, steel Kovar, moly, aluminum and its alloys, zinc, and others.

The process and systems of the present invention are applicable to the metallic plating of a wide variety of substrates (semiconductors, dielectrics, and metallic). It is noted that some of the objectives set forth in this invention are met in a recent patent, U.S. Pat. No. 3,993,801 which is included herein by reference.

In general, the process of the present invention comprises the following steps:

(A) Priming of the substrate, which has preferably first been etched, with a metal alloy or metal ions, preferably copper and silver or non-catalytic metals, (B) Immersing said substrate in a promoter composition containing metal ions selected from nickel, cobalt, iron and copper ions and mixtures thereof, and a reducing agent capable of reducing or interacting first with the metal or metal ions on the substrate and then heterogeneously reducing the ions in the promoter bulk solution to the metal state, and (C) Electrolessly plating said substrate by immersing said substrate in an electroless plating bath containing ions of the metal to be plated and a reducing agent capable of reducing heterogeneously the valence state of the ions in the electroless plating bath to the metallic state.

It is recognized that when dealing with bulk metals or alloys, the priming step does not exist per se. More specifically, in the plating of nickel or cobalt onto a substrate primed with silver or other non-catalytic metals, the process comprises the following steps:

(A) Immersing the primed substrate in a promoter solution containing ions of nickel or cobalt and a reducing agent capable of reducing the silver ion or interacting with metallic silver on said substrate and said nickel or cobalt ions to the metallic state; and (B) Immersing the developed substrate into an electroless plating both containing nickel or cobalt ions and a reducing agent capable of reducing said nickel or cobalt ions to their metallic state, e.g., a hypophosphite.

As noted previously, it is another specific object of the present invention to provide improved electroless copper plating onto copper primed substrates. This objective may be accomplished by developing the copper primed substrate with the developer solution described above for the plating of nickel or cobalt, or a similar bath containing copper ions, followed by immersion of the developed substrate in a conventional electroless copper-formaldehyde bath.

It is believed that improved copper plating is achieved using the above developer solutions through intensification of the sites on the substrate due to plating of copper, nickel or cobalt from the developer solution onto the substrate. Such intensification appears to be effected by the deposition onto the substrate of a thin layer, i.e., less than 1000 Å in thickness on the surface may be sufficient; however, for certain applications one may extend to greater thickness.

Suitable reducing agents used in the promoter solutions of the present invention may be any chemical reducing agent capable of reducing the ions on the substrate (or chemically interacting with the metal present on the surface) and also in the developer solution to the metallic state. In the chemical interaction, generally hydrogen gas is formed through the presence of a reactive intermediate adsorbed on the surface. While I do not wish to be bound by theory, the adsorbed intermediate may be chemisorbed nascent hydrogen or a hydride ion, both of which are short lived. Exemplary of such reducing agents are amine-boranes, borohydrides, hydrazine and its derivatives, N-alkyl-borazones, N-alkyl-borazoles, borazenes, borazines, and mixtures thereof. Particular reducing agents include dimethylamine borane, diethylene borane, and the alkali metal and alkaline earth metal borohydrides, such as potassium and sodium borohydrides.

The following are a few publications describing the use of miscellaneous reducing agents (e.g., hydrazine) which have been reported capable of both copper and nickel plating.

P. Fintschenko et al, Metal Finishing, January (1970).
D. J. Levy, Proc. Electroplaters Soc., 50, p. 29 (1963).
D. J. Levy, Electrochem. Tech., 1, No. 1-2, p. 38 (1963).
J. W. Dini et al, Plating, 54, p. 385 (1967).

While not wanting to be held to any particular theory, it is believed that treatment of the primed substrate with the promoter solution results in the reducing agent present in the developer solution first reducing the copper ions (or inter-acting with the metallic copper) present on the surface of the substrate to their metallic state (or an activated state), the reduction reaction being indicated by the formation of a brown color on the substrate. Thereafter, additional reducing agent in the developer solution heterogeneously reduces the valence state of the ions in the bulk developer solution to the metallic state causing plating of the metal onto the substrate. In the case of nickel, this latter step is indicated by the formation of a greyish color on the substrate. Accordingly, sufficient reducing agent should be present in the developer solution to insure the sequential reaction with the primed surface and thereafter heterogeneously reduce the ions in the developer solution. Thus for increased probability, a molar ratio of reducing agent to metal ions in the developer solution should exceed 1:1, and preferably should be at least 2:1. Ratios greater than about 15:1, while workable, are of little practical value and serve to increase the cost of the process. The molar concentration of the reducing agent will normally be within the range of from about 0.015 M to about 0.2 M; and the molar concentration of the metal ions will normally be within the range of from about 0.003 M to about 0.1 M. Surprisingly, it is noted that the concentration of reducing agents used in electroless plating baths (boron type), as referred in the prior art, all normally range from about 0.015 to about 0.2 m/l, while the metal ion concentration will range from about 0.02 to about 0.5 m/l. The molar ratio of reducing agent to metal ions, thus, is less than 1:1, and normally between 0.75 and 0.4. Such baths are taught, for example, in U.S. Pat. No. 3,338,726 as typical compositional make-up which are effective for electroless metal build-up.

Conventional electroless plating baths suitably used in plating in accordance with the present invention are comprised of ions of the metal to be plated, a complexing agent, and a reducing agent. In nickel or cobalt baths, the reducing agent commonly employed is a hypophosphite reducing agent, such as sodium hypophophite; in copper baths, the reducing agent commonly employed is formaldehyde or other electroless (chemical) plating baths which are not compatible with the substrates to be plated.

In the preparation of such baths, the metal ions are suitably derived from salts of the metal, e.g., the chloride or sulfate salts. Suitable complexing agents are well known in the art and include ethylenediamene tetraacetate, citrate and ammonia.

The following examples are presented as illustrative of the present invention and not in limitation thereof. In the examples where nickel ions are used in the developer or plating solutions, it will be apparent to one skilled in the art that cobalt ions, because of their similar properties, may be substituted.

EXAMPLE I

In this example as well as the following examples, the following procedure was employed:
1. Immerse ABS substrates, previously etched with a $CrO_3/H_2SO_4$ solution, into the described primer solution for several minutes;
2. Rinse;
3. Immerse primed substrate into the described developer solution;
4. Rinse (optional); and
5. Immerse developed substrate into described electroless plating bath.

In the present example, a primer solution having the following composition was used at room temperature:

| | |
|---|---|
| $SnCl_2.2H_2O$ | 81 g/l |
| CuCl | 6 g/l |
| HCl (conc.) | 45 cc/l |
| Phenol | 40 g/l |

Following immersion in the above primer solution, the primed substrates were rinsed and immersed in the following developer (promoter) solution:

| | |
|---|---|
| Dimethylamine borane (DMAB) | 3 g/l |
| $NiSO_4.6H_2O$ | 2.5 g/l |
| Citric acid.$H_2O$ | 3.6 g/l |
| $NH_4OH$ to pH | 8.8 |
| Temperature | 36° C. |

It was observed that within 2-3 minutes the surface becomes brown in color, and within 3-5 minutes a complete intensification took place as shown by a grey color.

Nickel plating was achieved by immersion of the developed substrate in the following electroless nickel-hypophosphite bath:

| Bath 1 | $NiSO_4.6H_2O$ | 12.5 g/l |
|---|---|---|
| | Citric acid.$H_2O$ | 18 g/l |
| | $NH_4OH$ to pH | 8.9 |
| | $NaH_2PO_2.H_2O$ | 18 g/l |
| | Temperature | C. |

As aforementioned, improved copper plating can also be achieved using the present improved developer solutions due to intensified site development. Thus, uniform plating of copper was achieved by immersion of a substrate developed in the foregoing manner into a conventional electroless copper-formaldehyde bath having the following composition:

| Bath 2 | $CuSO_4.5H_2O$ | 10 g/l |
|---|---|---|
| | $KNaC_4H_4O_6.4H_2O$ (potassium sodium tartrate) | 16 g/l |
| | NaOH | 16 g/l |
| | $H_2CO$ (37%) | 8 g/l |

EXAMPLE II

Electroless plating of nickel and copper was obtained using the procedure, primer solution and electroless plating baths of Example I with the following developer solution:

| DMAB | 3 g/l |
| --- | --- |
| CoSO$_4$.7H$_2$O | 1.25 g/l |
| Sodium citrate.2H$_2$O | 2.5 g/l |
| NH$_4$OH to pH | 8.8 |
| Temperature | 36° C. |

EXAMPLE III

Electroless plating of nickel and copper was obtained using the procedure, primer solution and electroless plating baths of Example I with the following developer solution:

| DMAB | 3 g/l |
| --- | --- |
| CoSO$_4$.7H$_2$O | 1.25 g/l |
| Sodium citrate.2H$_2$O | 2.5 g/l |
| CuSO$_4$.5H$_2$O | 0.072 g/l |
| NH$_4$OH to pH | 8.8 |
| Temperature | 36° C. |

It should be noted that this composition is more reactive in comparison to the composition of Example II and thus lowering of the reactivity is recommended. Moreover, it should be obvious to those skilled in the art of plating that the catalytic surface resulting at the conclusion of the development stage consists of both cobalt and copper.

EXAMPLE IV

Electroless plating of nickel and copper was obtained using the procedure, primer solution and electroless plating baths of Example I with the following developer solution:

| DMAB | 3 g/l |
| --- | --- |
| Nickel sulfamate | 0.8 g/l (Ni) |
| NH$_4$OH to pH | 8 |
| Temperature | 38° C. |

Good intensified development took place within 5 minutes. Additional Tergitol (TMN) surfactant seemed to improve the overall uniformity.

EXAMPLE V

In this example, priming of the ABS substrate was achieved using as the primed solution a hydrous oxide colloid of copper prepared by adding 400 ml of 0.025 molar NH$_4$OH dropwise with stirring to 1600 ml of 0.0125 molar copper acetate.

ABS substrates primed with the above colloidal solution were developed using the following developer solution:

| DMAB | 4 g/l |
| --- | --- |
| Nickel sulfamate | 1.6 g/l (Ni) |
| NaOH to OH | 6.2 |
| Temperature | 44° C. |

Using the electroless nickel bath of Example I, a complete intensified developed surface was obtained within 5 minutes of immersion, and good initiation in the electroless bath was noted. It should be noted that using a modified developer formulation similar to Example No. 1 was poor, probably due to the presence of ammonia. Based upon this example and procedure, it should be obvious that hydrous oxide colloids of cobalt and nickel may be used as well as combinations thereof.

EXAMPLE VI

| DMAB | 1.5 g/l |
| --- | --- |
| NiSO$_4$.6H$_2$O | 1.25 g/l |
| Citric acid.H$_2$O | 1.8 g/l |
| NH$_4$OH to pH | 7.8 |
| Temperature | 37° C. |

When substituting the above solution after a partial degassing for the developer solution of Example V, it was noted that development took place within 2 minutes while complete intensification took place in about 8 minutes. In this example, no agitation or surfactant was included. The intensified developed substrate was directly immersed into the electroless nickel bath of Example I with good immediate initiation noted. Dilution (×2) of the above modified developer formulation under the same conditions did result in intensified development, however with a lower speed.

EXAMPLE VII

Electroless plating of nickel was obtained using the procedure, primer solution and electroless nickel plating bath of Example I with the following developer solution:

| NiCl$_2$.6H$_2$O | 3 g/l |
| --- | --- |
| Ethylene diamine | 5 g/l |
| Potassium borohydride | 1 g/l |
| pH | 9.9 |
| Temperature | 38° C. |

Standard development was noted within two to three minutes of immersion, while complete intensification was observed only after about twelve minutes of immersion. The latter could be foreshortened by further adjusting developer reactivity and probably by lowering or eliminating the ethylenediamene concentration. Following the intensified development good initiation in the electroless bath No. 1 took place. To overcome some of the stability problems associated with borohydrides, the use of salts of cyano-borohydrides is recommended. The latter show good stability over a wide pH range.

EXAMPLE VIII

As stated previously, one of the novel features of this invention is the fact that development and intensification take place in the same medium in a preferred sequence of events. This feature is accomplished to a large extent by the relative concentration make-up of the developer solution. To better illustrate this point the following results are provided.

| | | Observed timing (minutes) to: | |
| --- | --- | --- | --- |
| No. | DMAB (a)/ NiSO$_4$.6H$_2$O(g/g) in modified solution | Development (brown color formation) | Intensified Development (grey color formation) |
| 1 | 3/12.5 | (b) | none after 7 min. |
| 2 | 3/6.25 | (b) | 40% only after 7 min. |
| 3 | 3/3.12 | 2½ | 4 |

-continued

| | | Observed timing (minutes) to: | |
|---|---|---|---|
| No. | DMAB (a)/ $NiSO_4.6H_2O$(g/g) in modified solution | Development (brown color formation) | Intensified Development (grey color formation) |
| 4 | 3/1.6 | 2½ | 4 |

(a) All developer solutions were operated at 39° C. and were also composed of citric acid $H_2O$ at ×1.44 the weight of nickel sulfate.hexahydrate. Ammonium hydroxide was used to maintain a pH of 8.7.
(b) The observation of a brown color was non-reproducible and in cases in which a brown color was formed, the intensified development was sluggish.

EXAMPLE IX

A ceramic substrate coated with silver was used; the silver was derived from a printable ink composition. After activation in a 20% hydrochloric acid, the substrate was effectively treated in the developer of example I and then in electroless nickel-phosphorus formulation. It is recognized that in using surface primed with silver, it is advantageous to include within the developer composition a silver complexing agent. Such inclusion will extend the life of the developer composition, hence making the process more economical.

I have also found that due to the non-noble (precious) characteristic of silver it may be required to treat the silver surface prior to the developer composition as to dissolve any oxide layer.

EXAMPLE X

Cleaned non-catalytic materials such as moly, chromium, copper, chromium containing steel, and an alloy of aluminum (7075 T6, 6061 T6), were contacted for 1 to 2 minutes in a composition of Example I at temperature range 60° to 70° C. After this treatment, the materials were immersed in a conventional electroless nickel using hypophosphite as the reducing agent. It was noted that instantaneous plating was started. The plated parts surprisingly have also shown good adhesion before and after heat treatment.

What I claim is:
1. A metallized article, said article being a silver coated ceramic substrate, produced by the steps comprising,
    (a) contacting said silver coated ceramic substrate with a composition thereby rendering said substrate receptive to conventional electroless plating and wherein said composition comprises metal ions and only a single reducing agent and wherein said reducing agent is capable of chemically reacting with said silver coated ceramic substrate and the metal ions within said composition and wherein the metal ions are selected from the group consisting of nickel, cobalt, and iron and mixtures thereof, and wherein the relative molar concentration of the reducing agent to the metal ions is so adjusted as to permit the initial chemical interaction of the reducing agent with said silver coated ceramic substrate and then the heterogeneous reduction of some of the metal ions present in said composition and then,
    (b) contacting the treated silver coated ceramic substrate with a conventional electroless plating bath thereby depositing a metallic layer and wherein said bath comprises hypophosphite.
2. The article according to claim 1 wherein said silver is derived from a printable ink composition comprising silver.
3. The article according to claim 2 wherein said reducing agent is selected from the group consisting of amineboranes, borohydrides, and hydrazine.
4. The article according to claim 1 wherein said relative molar concentration of reducing agent to metal ions is at least 1:1.
5. The article according to claim 1 wherein said composition is used at an alkaline pH.
6. The article according to claim 1 wherein said electroless plating bath comprises nickel ions.
7. The article according to claim 1 wherein said composition is used above room temperature.

* * * * *